United States Patent
Choi et al.

(10) Patent No.: US 7,476,896 B2
(45) Date of Patent: Jan. 13, 2009

(54) THIN FILM TRANSISTOR AND METHOD OF FABRICATING THE SAME

(75) Inventors: Dae Chul Choi, Seoul (KR); Byoung Deog Choi, Yongin (KR); Choong Youl Im, Yongin (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/361,727

(22) Filed: Feb. 23, 2006

(65) Prior Publication Data

US 2006/0246639 A1  Nov. 2, 2006

(30) Foreign Application Priority Data

Apr. 28, 2005 (KR) .................. 10-2005-0035785

(51) Int. Cl.
| | |
|---|---|
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 29/76 | (2006.01) |
| H01L 31/112 | (2006.01) |
| H01L 29/15 | (2006.01) |
| H01L 29/47 | (2006.01) |
| H01L 29/812 | (2006.01) |
| H01L 31/07 | (2006.01) |
| H01L 31/108 | (2006.01) |

(52) U.S. Cl. .................. 257/57; 257/59; 257/66; 257/73; 257/291

(58) Field of Classification Search .......... 257/57, 257/59, 66, 73, 291

See application file for complete search history.

(56) References Cited

U.S. PATENT DOCUMENTS

| | | | |
|---|---|---|---|
| 4,670,763 A | | 6/1987 | Ovshinsky et al. |
| 5,241,197 A | * | 8/1993 | Murakami et al. .......... 257/192 |
| 5,808,316 A | | 9/1998 | Matsuda et al. |
| 6,051,509 A | * | 4/2000 | Tsuchiaki ................ 438/758 |
| 6,140,165 A | * | 10/2000 | Zhang et al. ............. 438/166 |

(Continued)

FOREIGN PATENT DOCUMENTS

CN  1134600 A  10/1996

(Continued)

OTHER PUBLICATIONS

English abstract for CN 1134600 A, listed above.

(Continued)

*Primary Examiner*—Ida M Soward
(74) *Attorney, Agent, or Firm*—Christie, Parker & Hale, LLP

(57) ABSTRACT

A thin film transistor (TFT) and a method of fabricating the same, in which a fabrication process is simplified and damage to a gate insulating layer is decreased. The method of fabricating the TFT includes forming at least one buffer layer on a substrate, forming a first semiconductor layer formed on the buffer layer and a second semiconductor layer by depositing a semiconductor doped with a dopant on the first semiconductor layer, patterning the second semiconductor layer to form source and drain regions, forming a gate insulating layer on the source and drain regions, and forming a gate electrode on the gate insulating layer.

21 Claims, 5 Drawing Sheets

U.S. PATENT DOCUMENTS

| | | | |
|---|---|---|---|
| 6,410,372 B2 | 6/2002 | Flewitt | |
| 6,483,124 B2 | 11/2002 | Flewitt | |
| 6,696,309 B2 * | 2/2004 | Yamanaka et al. | 438/30 |
| 6,747,838 B2 * | 6/2004 | Korbel et al. | 360/78.06 |
| 6,794,277 B2 * | 9/2004 | Machida et al. | 438/535 |
| 6,936,504 B2 * | 8/2005 | Joo et al. | 438/166 |
| 6,991,974 B2 * | 1/2006 | Tsao | 438/151 |
| 7,094,624 B2 * | 8/2006 | Park et al. | 438/82 |
| 7,095,043 B2 * | 8/2006 | Oda et al. | 257/19 |
| 2003/0230748 A1 * | 12/2003 | Shih | 257/59 |

FOREIGN PATENT DOCUMENTS

| | | |
|---|---|---|
| CN | 1350326 A | 5/2002 |
| JP | 60-254660 | 12/1985 |
| JP | 5-232515 | 9/1993 |
| JP | 2001-210836 | 8/2001 |
| KR | 1998-0873766 | 12/1998 |
| KR | 2002-0002655 | 1/2002 |
| KR | 2005-0070240 | 7/2005 |

OTHER PUBLICATIONS

English abstract fo JP 60-254660, listed above.
Singapore Office action dated Apr. 4, 2008, for Chinese Application 2006100586719, with English translation indicating relevance of Chinese reference listed in this IDS.
Patent Abstracts of Japan, Publication No. 05-232515, dated Sep. 10, 1993, in the name of Shunpei Yamazaki et al.
Patent Abstracts of Japan, Publication No. 2001-210836, dated Aug. 3, 2001, in the name of Koyu Cho.
SIPO Office action dated Aug. 15, 2008, for corresponding China Application 2006100586719, with English translation indicating relevance of references listed in this IDS.

* cited by examiner

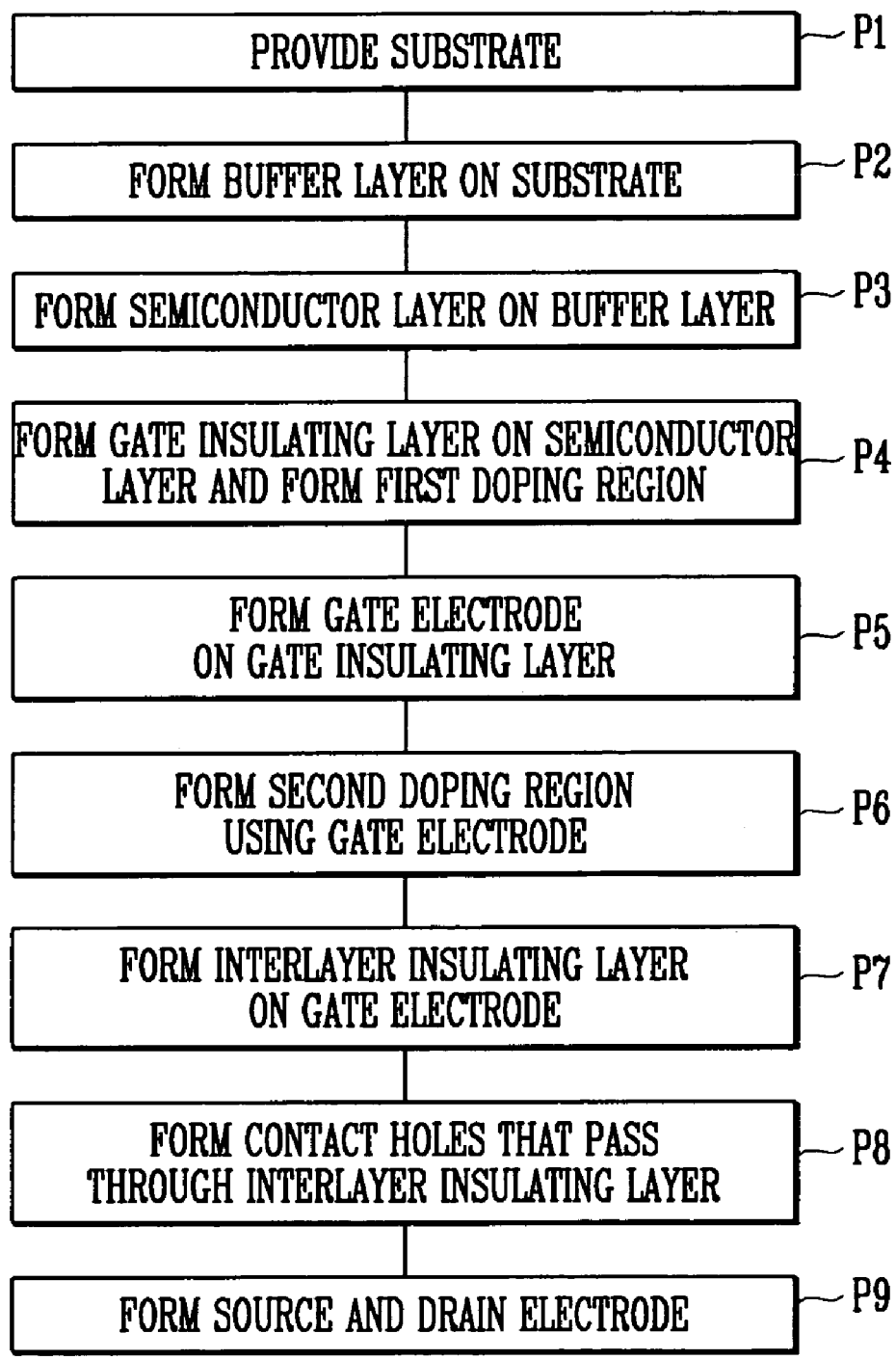

THIN FILM TRANSISTOR AND METHOD OF FABRICATING THE SAME

CROSS-REFERENCE TO RELATED APPLICATIONS

This application claims priority to and the benefit of Korean Patent Application No. 10-2005-0035785, filed on Apr. 28, 2005, in the Korean Intellectual Property Office, the entire content of which is incorporated herein by reference.

BACKGROUND

1. Field of the Invention

The embodiments of the present invention relate to a thin film transistor (TFT) and a method of fabricating the same and more particularly to a TFT and a method of fabricating the same, in which a fabrication process is simplified and the potential for damage to a gate insulating layer is decreased.

2. Discussion of Related Art

Recently, thin film transistors (TFT) have become widely used as switching devices that operate pixels in displays such as organic light emitting displays (OLED) and liquid crystal displays (LCD). Therefore, a great deal of attention has been focused on the design of effective TFTs and the fabrication of TFTs.

The process of fabricating conventional TFTs is described in detail with reference to the FIGS. 1 to 2F. FIG. 1 is a flowchart showing a process of fabricating conventional TFTs. FIGS. 2A to 2F are sectional views illustrating the process of fabricating the conventional TFTs of FIG. 1.

Referring to FIGS. 1 and 2A to 2F, to fabricate a conventional TFT 200, first, a substrate 201 is provided (block P1).

After the substrate 201 is provided, a buffer layer 202 is formed on the substrate 201. The buffer layer 202 is an optional component and may be formed of a single layer or a plurality of layers. A nitride layer or an oxide layer is used as the buffer layer 202. The buffer layer 202 of the TFT 200 illustrated in FIGS. 2A to 2F is composed of a first buffer layer 202a formed of a nitride layer and a second buffer layer 202b formed of an oxide layer (block P2).

After the buffer layer 202 is formed, an amorphous silicon layer a-Si is formed on the second buffer layer 202b. The formed amorphous silicon layer a-Si is crystallized by application of a laser. When the amorphous silicon layer a-Si is crystallized, the crystallized amorphous silicon layer a-Si is patterned to form a semiconductor layer 203 (block P3)

Referring to FIG. 2B, after the semiconductor layer 203 is formed, a gate insulating layer 204 is formed on the semiconductor layer 203. After the gate insulating layer 204 is formed, a mask 210 is formed. The mask 210 is formed on the gate insulating layer 204, covering a first region 203a of the semiconductor layer 203. Thus, the regions of the semiconductor layer 203b other than the first region 203a are doped using the mask 210. An n or p type dopant may be implanted. The doped semiconductor layer region 203b becomes source and drain regions and is referred to as a first doping region 203b (block P4). After the first doping region 203b is formed, the mask 210 is removed.

Referring to FIG. 2C, next, a metal layer (not shown) is formed on the gate insulating layer 204. The formed metal layer is patterned to form a gate electrode 205 (block P5).

After the gate electrode 205 is formed, a second doping region 203c is formed in the semiconductor layer 203 using the gate electrode 205 as a mask. The second doping region 203c is a lightly doped drain (LDD) region formed between the first doping region 203b and the first region or channel 203a of the semiconductor layer 203 (block P6).

Referring to FIG. 2D, after the second doping region 203c is formed, an interlayer insulating layer 206 is formed on the gate electrode 205 (block P7).

Referring to FIG. 2E, after the interlayer insulating layer 206 is formed, a plurality of contact holes 207 that expose the source and drain regions (i.e., the first doping regions 203b) are formed through the interlayer insulating layer 206 (block P8).

Referring to FIG. 2F, after the contact holes 207 are formed, source and drain electrodes 208 of the TFT 200 that are electrically connected to the first doping region 203b and are formed through the contact holes 207 (block P9).

The conventional TFT 200 is fabricated through the foregoing process (blocks P1 through P9). In this fabrication process (blocks P1 through P9), masks are needed for forming the first and second doping regions 203b and 203c, as a result the total fabrication process is complicated. Further, the gate insulating layer 204 may be damaged during the doping process, and a dopant may be non-uniformly distributed. Therefore, the TFT 200 may breakdown and the mobility may deteriorate.

SUMMARY

Accordingly, it is an aspect of the present invention to provide a thin film transistor (TFT) and a method of fabricating the same, in which a dopant is uniformly distributed in the source and drain regions, a gate insulating layer is protected from being damaged during the fabrication process, and the fabrication process, as a whole, is simplified.

The embodiments of the present invention include a method of fabricating a thin film transistor. The fabrication method includes forming at least one buffer layer on a substrate and forming a semiconductor layer that includes a first semiconductor layer that is formed on the buffer layer and a second semiconductor layer that is formed by depositing a doped semiconductor on the first semiconductor layer. The fabrication method also includes patterning the second semiconductor layer to form source and drain regions and forming a gate insulating layer on the source and drain regions, as well as, forming a gate electrode on the gate insulating layer.

The first semiconductor layer may be formed by depositing a semiconductor doped with an n or p type dopant on the buffer layer by a low pressure chemical vapor deposition (LPCVD) method or a plasma-enhanced chemical vapor deposition (PECVD) method. Further, the first semiconductor layer is formed by depositing microcrystalline or amorphous silicon doped with a dopant. The second semiconductor layer is formed by directly depositing a semiconductor doped with an n or p type dopant on the first semiconductor layer by an LPCVD method or a PECVD method. The first semiconductor layer and the second semiconductor layer may be successively formed in the same chamber. The dopant used in forming the second semiconductor layer may include boron. Forming the source and drain regions may include performing a patterning process, an etching process, and a stripping process using a mask. The method further includes forming an inter-insulating layer on the gate electrode and forming source and drain electrodes on the inter-insulating layer that are electrically connected with the source and drain regions.

In another embodiment of the present invention, a thin film transistor includes at least one buffer layer formed on a substrate, a first semiconductor layer formed on the buffer layer, source and drain regions formed on the first semiconductor layer, a gate insulating layer formed on the source and drain regions, and a gate electrode formed on the gate insulating layer, where the source and drain regions include a semiconductor doped with an n or p type dopant.

The first semiconductor layer may include a semiconductor layer doped with an n or p type dopant different in type from the source and drain regions. The first semiconductor layer may include microcrystalline or amorphous silicon doped with an n or p type dopant. The source and drain regions may include a semiconductor doped with boron. The thin film transistor may further include an inter-insulating layer formed on the gate electrode and source and drain electrodes that are formed on the inter-insulating layer and electrically connected with the source and drain regions.

BRIEF DESCRIPTION OF THE DRAWINGS

These and/or other aspects and advantages of the invention will become apparent and more readily appreciated from the following description of the embodiments of the invention, taken in conjunction with the accompanying drawings.

FIG. 1 is a flowchart illustrating a fabrication process of a conventional thin film transistor (TFT);

DETAILED DESCRIPTION

Embodiments of the present invention will be described with reference to FIGS. 3 to 4C.

Figure 2A:
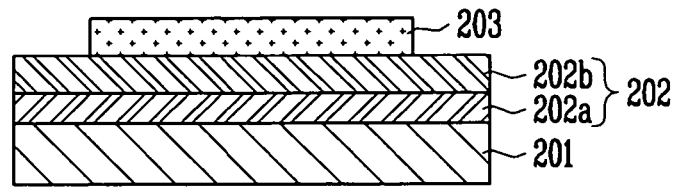
FIG. 2A is a sectional view of a first stage of fabrication process for a conventional TFT.
Figure 2B:
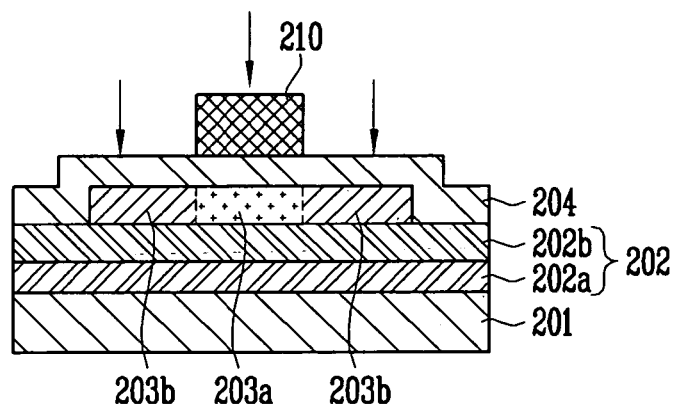
FIG. 2B is a sectional view of a second stage of fabrication process for a conventional TFT.
Figure 2C:
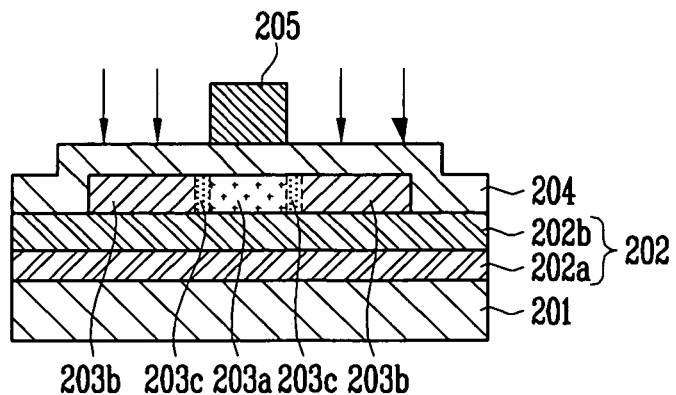
FIG. 2C is a sectional view of a third stage of fabrication process for a conventional TFT.
Figure 2D:
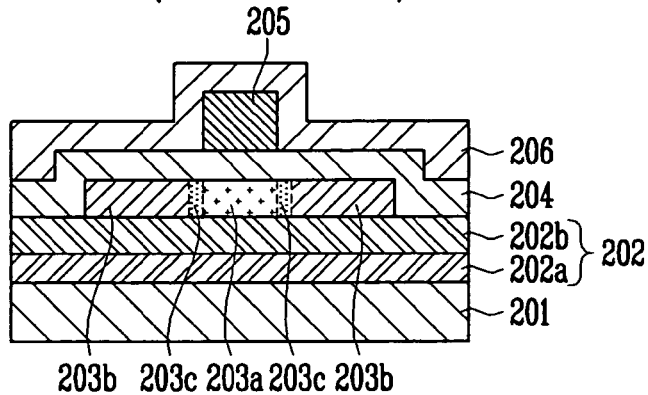
FIG. 2D is a sectional view of a fourth stage of fabrication process for a conventional TFT.
Figure 2E:
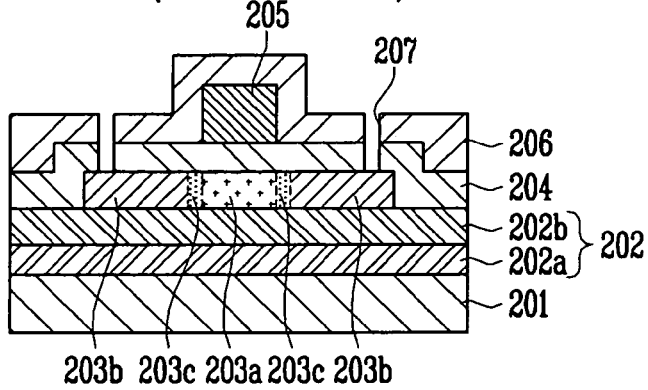
FIG. 2E is a sectional view of a fifth stage of fabrication process for a conventional TFT.
Figure 2F:
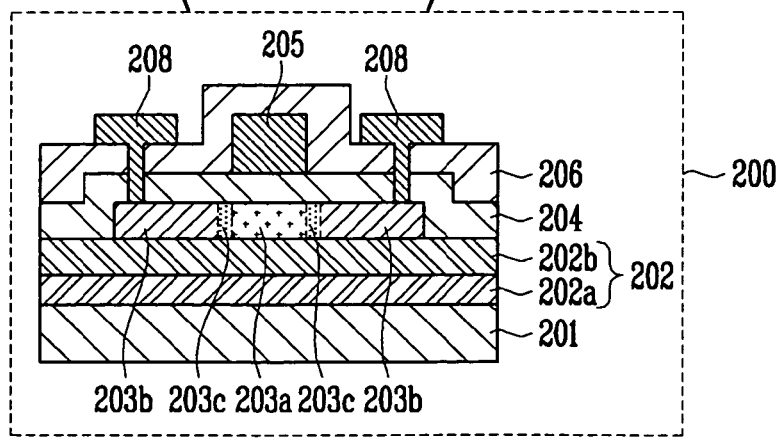
FIG. 2F is a sectional view of a sixth stage of fabrication process for a conventional TFT.
Figure 3:
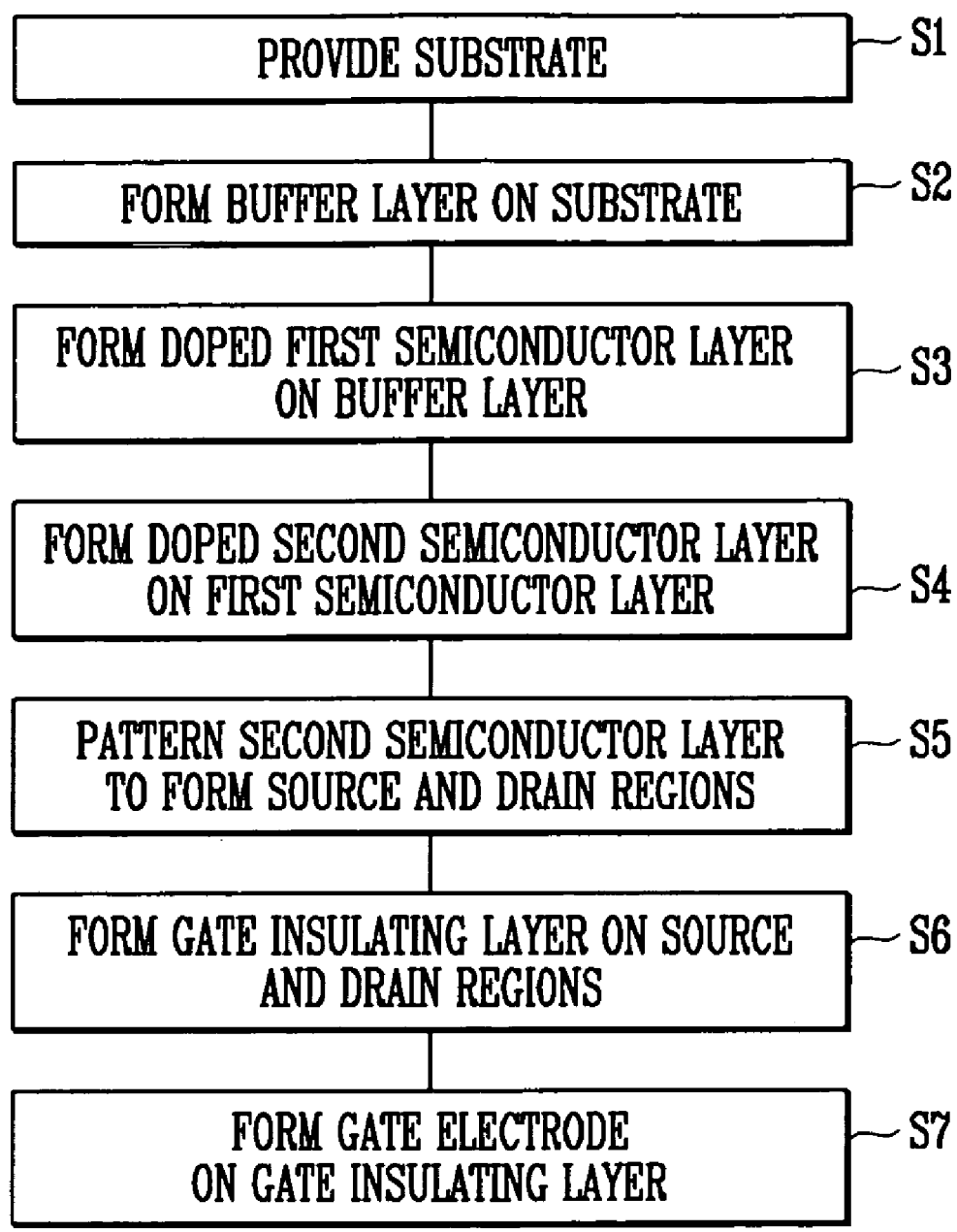
FIG. 3 is a flowchart illustrating one embodiment of a fabrication process for a TFT.

FIG. 3 is a flowchart illustrating a fabrication process for a thin film transistor (TFT) according to one embodiment of the present invention. As used herein, the term process may include a series of actions that may include further processes.

Referring to FIG. 3, a substrate is provided (block S1). The fabrication process for the TFT, according to one embodiment, includes a process of forming a buffer layer on the substrate (block S2), a process of forming a doped first semiconductor layer on the buffer layer (block S3), a process of forming a doped second semiconductor layer on the first semiconductor layer (block S4), a process of patterning the second semiconductor layer to form source and drain regions (block S5), a process of forming a gate insulating layer on the source and drain regions (block S6) and a process of forming a gate electrode on the gate insulating layer (block S7).

It would be appreciated by those skilled in the art that the fabrication process for the gate electrode further includes a process for forming an inter-insulating layer on the gate electrode and a source electrode and a drain electrode on the inter-insulating layer, which is not shown in FIG. 3.

The fabrication process for the TFT according to the present embodiment will be described in detail with reference to FIGS. 4A through 4C, which are sectional views illustrating the fabrication process for the TFT shown in FIG. 3.

Figure 4A:
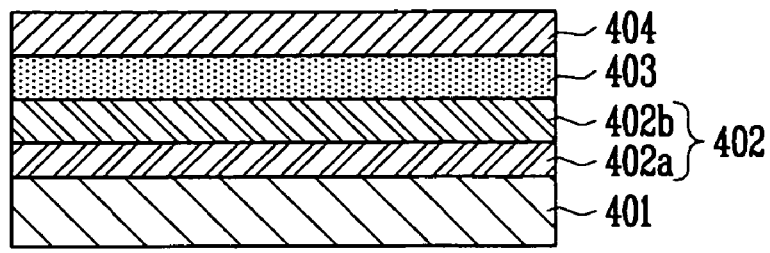
FIG. 4A is a sectional view of one embodiment of a first stage in a fabrication process for a TFT.
Figure 4B:
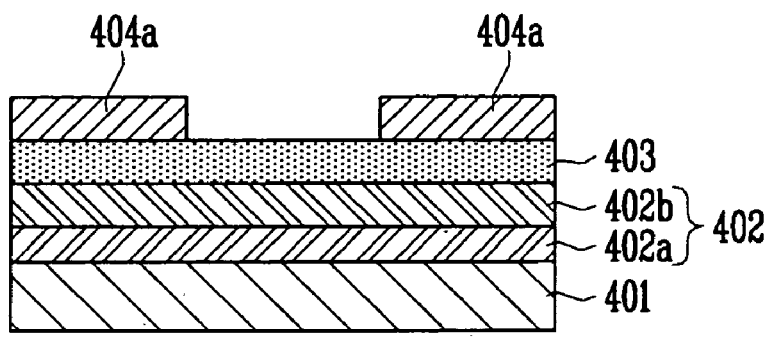
FIG. 4B is a sectional view of one embodiment of a second stage in a fabrication process for a TFT.
Figure 4C:
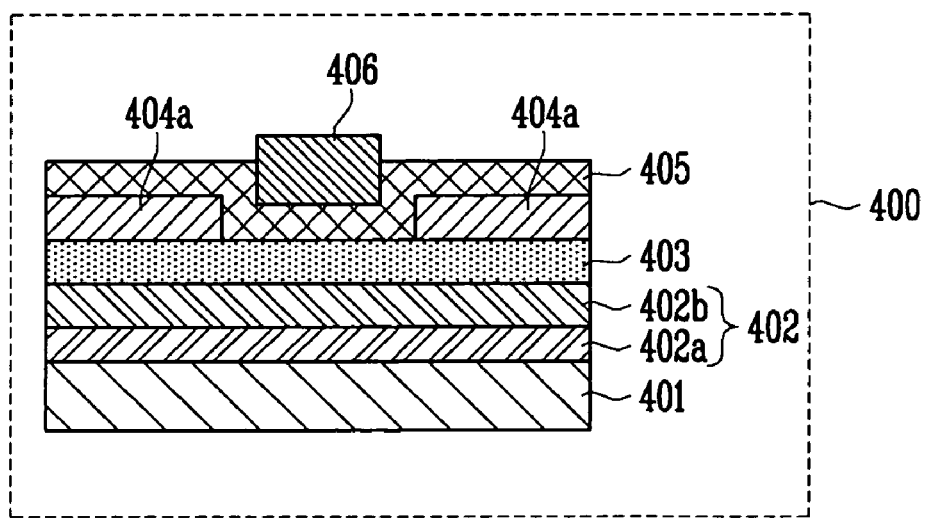
FIG. 4C is a sectional view of one embodiment of a third stage in a fabrication process for a TFT.

Referring to FIGS. 4A to 4C, to fabricate a TFT 400 according to one embodiment of the present invention, first, a substrate 401 is provided (block S1).

After the substrate 401 is provided, a buffer layer 402 may be formed on the substrate 401. The buffer layer 402 is an optional component that may be formed of a single layer or a plurality of layers. A nitride layer or an oxide layer may be used as the buffer layer 402. The buffer layer 402, according to one embodiment, may be composed of a first buffer layer 402a formed from a nitride layer and a second buffer layer 402b formed from an oxide layer (block S2).

After the buffer layer 402 is formed, a first semiconductor layer 403 may be formed on the second buffer layer 402b by a low pressure chemical vapor deposition (LPCVD) method or a plasma enhanced chemical vapor deposition (PECVD) method. In one embodiment, the first semiconductor layer 403 is formed of an n or p type doped microcrystalline silicon μ-Si or amorphous silicon a-Si dependent on the type of channel to be formed. In another embodiment, the first semiconductor layer 403 may be formed as an intrinsic semiconductor. When the TFT 400 operates, a channel is formed in the first semiconductor layer 403. (block S3).

Referring to FIG. 4A, after the first semiconductor layer 403 is formed, a doped second semiconductor layer 404 may be formed on the first semiconductor layer 403 by the LPCVD method or the PECVD method. In one embodiment, the second semiconductor layer 404 is formed subsequent to the first semiconductor layer 403 in the same chamber for forming the first semiconductor layer 403 without altering the chamber. The second semiconductor layer 404 may also be formed by depositing an n or p type previously doped semiconductor, dependent on the type of the TFT 400 to be formed. For example, the second semiconductor layer 404 may be formed by depositing boron doped semiconductor. In this example, the TFT 400 becomes a p type transistor (block S4).

Referring to FIG. 4B, after the second semiconductor layer 404 is formed, the second semiconductor layer 404 may be patterned to form source and drain regions 404a. A mask process, an etching process or a stripping process may be used. Because the first semiconductor layer 403 and the second semiconductor layer 404, which is directly deposited on the first semiconductor layer 403 to form the source and drain regions 404a, are used as the semiconductor layer of the TFT 400, a gate insulating layer 405 is protected from being damaged during the doping process. Thus, the potential for a breakdown of the TFT 400 is decreased, thereby enhancing the characteristics of the TFT 400 (block S5).

After the source and drain regions 404a are formed, the gate insulating layer 405 may be formed on the source and drain regions 404a. The gate insulating layer 405 is an optional component that may be formed of a single layer or a plurality of layers. A nitride layer or an oxide layer may be used as the gate insulating layer 405 (block S6).

Referring to FIG. 4C, after the gate insulating layer 405 is formed, a metal layer (not shown) may be formed on the gate insulating layer 405. The metal layer may be patterned to form a gate electrode 406 (block S7).

Thereafter, an inter-insulating layer (not shown) may be formed on the gate electrode 406, and then source and drain electrodes (not shown) may be formed on the inter-insulating layer and electrically connected to the source and drain regions 404a.

The TFT 400 according to one embodiment is fabricated through the above-described process (blocks S1 to S7). That is, the TFT formed in one embodiment includes at least one buffer layer 402 formed on the substrate 401, the first semiconductor layer 403 formed on the buffer layer 402, the source and drain regions 404a formed on the first semiconductor layer 403, the gate insulating layer 405 formed on the source and drain regions 404a, the gate electrode 406 formed on the gate insulating layer 405, the inter-insulating layer formed on the gate electrode 406, and the source and drain electrodes electrically connected with the source and drain regions 404a, respectively. The first semiconductor layer 403 may be formed by depositing microcrystalline silicon or amorphous silicon previously doped with a dopant of a type different from the type of the source and drain regions, either n or p types, by the LPCVD method or the PECVD method. According to one embodiment of the present invention, the first semiconductor layer 403 may not be limited to being a doped semiconductor layer and may instead be formed as an intrinsic semiconductor layer. The first semiconductor layer 403 may form a channel when the TFT 400 operates. The second or boron doped semiconductor layer 404 may be deposited by the LPCVD method or the PECVD method and/or may be patterned to form the source and drain regions 404a. In one embodiment, the source and drain regions 404a are formed of a boron doped semiconductor. However, the source and drain regions 404a may be formed of semiconductor doped with various n or p type dopants.

In one embodiment, the doped second semiconductor layer 404 may be successively and directly deposited on the doped first semiconductor layer 403 to form the source and drain regions 404a, so that a dopant is uniformly distributed in the source and drain regions 404a and the gate insulating layer is protected from being damaged in the processes. Further, a doping process using a mask is not performed while the source and drain regions 404a are formed, so that the total process is simplified.

The source and drain regions are formed by directly depositing the doped semiconductor on the first semiconductor layer, so that the gate insulating layer is protected from being damaged in the doping process. Thus, the characteristics of the TFT are improved, for example, the potential for breakdown of the TFT is decreased. Further, the dopant is uniformly distributed within the source and drain regions, thereby enhancing mobility. Also, a doping process using a mask is not performed while the source and drain regions are formed, so that total process is simplified.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor comprising:
a buffer layer on a substrate;
a first semiconductor layer on the buffer layer and comprising a channel of the thin film transistor;
a second semiconductor layer on the first semiconductor layer and comprising:
a source region on the first semiconductor layer, and
a drain region on the first semiconductor layer and spaced apart from the source region;
a gate insulating layer on the source and drain regions and comprising an insulating portion between the source region and the drain region; and
a gate electrode formed on the gate insulating layer,
wherein the source and drain regions comprise a semiconductor doped with an n or p type dopant.

2. The thin film transistor of claim 1, wherein the gate electrode is formed on the gate insulating layer to correspond in position to the insulating portion between the source region and the drain region.

3. The thin film transistor of claim 1, wherein the source and drain regions comprise a dopant uniformly distributed in the source and drain regions.

4. The thin film transistor of claim 1, wherein the buffer layer comprises a nitride layer and an oxide layer, and wherein the nitride layer is between the oxide layer and the substrate.

5. The thin film transistor of claim 1, wherein the insulating portion of the gate insulating layer is between the sides of the source and drain regions.

6. A thin film transistor comprising:
a buffer layer on a substrate;
a first semiconductor layer on the buffer layer and comprising a channel of the thin film transistor;
a second semiconductor layer on the first semiconductor layer and comprising a source region and a drain region;
a gate insulating layer between the source region and the drain region and on the first semiconductor layer; and
a gate electrode on the gate insulating layer,
wherein the source and drain regions comprise a semiconductor doped with an n or p type dopant.

7. The thin film transistor of claim 6, wherein the gate insulating layer is between the sides of the source and drain regions.

8. The thin film transistor of claim 6, wherein the source and drain regions include a semiconductor doped with boron.

9. The thin film transistor of claim 6, wherein the gate insulating layer comprises a first portion and a second portion, and wherein the gate electrode is formed between the first portion of the gate insulating layer and the second portion of the gate insulating layer.

10. The thin film transistor of claim 6, wherein the gate insulating layer comprises a first portion, a second portion, and a third portion, and wherein the gate electrode is on the first portion of the gate insulating layer and between the second portion of the gate insulating layer and the third portion of the gate insulating layer.

11. The thin film transistor of claim 6, wherein the source and drain regions comprise a dopant uniformly distributed in the source and drain regions.

12. The thin film transistor of claim 6, wherein the buffer layer comprises a first buffer layer comprising a nitride layer and a second buffer layer comprising an oxide layer, and wherein the first buffer layer is between the second buffer layer and the substrate.

13. The thin film transistor of claim 6, wherein the gate insulating layer comprises a first portion on the source region, a second portion on the drain region, and a third portion between the source region and the drain region, wherein the gate electrode is on the third portion of the gate insulating layer and between the first portion of the gate insulating layer and the second portion of the gate insulating layer, and wherein the source and drain regions comprise a dopant uniformly distributed in the source and drain regions.

14. The thin film transistor of claim 6, wherein the source and drain regions are configured on the first semiconductor layer to protect the gate insulating layer from being damaged by a doping process.

15. The thin film transistor of claim 6, wherein the first semiconductor layer includes a semiconductor layer doped with an n or p type dopant different in type from the source and drain regions.

16. The thin film transistor of claim 15, wherein the first semiconductor layer includes a microcrystalline silicon doped with an n or p type dopant or an amorphous silicon doped with an n or p type dopant.

17. The thin film transistor of claim 6, wherein the gate insulating layer comprises a first portion on the source region, a second portion on the drain region, and a third portion between the source region and the drain region.

18. The thin film transistor of claim 17, wherein the gate electrode is formed on the gate insulating layer to correspond in position to the third portion of the gate insulating layer.

19. The thin film transistor of claim 17, wherein the gate electrode is formed on the third portion of the gate insulating layer.

20. The thin film transistor of claim 17, wherein the gate electrode is between the first portion of the gate insulating layer and the second portion of the gate insulating layer.

21. The thin film transistor of claim 17, wherein the gate electrode is formed on the third portion of the gate insulating layer and between the first portion of the gate insulating layer and the second portion of the gate insulating layer.

* * * * *